US012557633B2

(12) United States Patent
Li et al.

(10) Patent No.: US 12,557,633 B2
(45) Date of Patent: Feb. 17, 2026

(54) MULTIPLE CRITICAL DIMENSION POWER RAIL

(71) Applicant: INTERNATIONAL BUSINESS MACHINES CORPORATION, Armonk, NY (US)

(72) Inventors: Tao Li, Slingerlands, NY (US); Liqiao Qin, Albany, NY (US); Ruilong Xie, Niskayuna, NY (US); Kisik Choi, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 535 days.

(21) Appl. No.: 17/807,391

(22) Filed: Jun. 17, 2022

(65) Prior Publication Data
US 2023/0411292 A1 Dec. 21, 2023

(51) Int. Cl.
| | | |
|---|---|---|
| *H01L 23/528* | (2006.01) | |
| *H01L 21/762* | (2006.01) | |
| *H01L 21/768* | (2006.01) | |
| *H01L 23/535* | (2006.01) | |
| *H10D 62/10* | (2025.01) | |

(52) U.S. Cl.
CPC .... *H01L 23/5286* (2013.01); *H01L 21/76229* (2013.01); *H01L 21/76838* (2013.01); *H01L 21/76898* (2013.01); *H01L 23/535* (2013.01); *H10D 62/115* (2025.01)

(58) Field of Classification Search
CPC . H01L 23/5286; H01L 23/535; H01L 23/481; H01L 23/5283; H01L 21/76229; H01L 21/76838; H01L 21/76898; H10D 62/115; H10D 84/83; H10D 84/981; H10D 89/10; H10D 84/0149; H10D 84/038
See application file for complete search history.

(56) References Cited

U.S. PATENT DOCUMENTS

| | | |
|---|---|---|
| 9,570,395 B1 | 2/2017 | Sengupta |
| 10,586,765 B2 | 3/2020 | Smith |
| 10,636,739 B2 | 4/2020 | Beyne |
| (Continued) | | |

FOREIGN PATENT DOCUMENTS

| | | |
|---|---|---|
| CN | 111968969 A | 11/2020 |
| EP | 3940789 A1 | 1/2022 |
| (Continued) | | |

OTHER PUBLICATIONS

International Searching Authority, "Notification of Transmittal of the International Search Report and the Written Opinion of the International Searching Authority, or the Declaration", International application No. PCT/EP2023/064687, International Filing Date Jun. 1, 2023, Mailed on Nov. 14, 2023, 16 pages.

(Continued)

*Primary Examiner* — Dao H Nguyen
(74) *Attorney, Agent, or Firm* — Gavin Giraud

(57) ABSTRACT

Embodiments disclosed herein include a semiconductor structure. The semiconductor structure may include a first transistor device on a substrate, a second transistor device on the substrate, and a power rail between the first transistor device and the second transistor device. The power rail may include a first section with a first critical dimension (CD), a second section with a second CD, and a third section with a third CD.

25 Claims, 21 Drawing Sheets

(56) References Cited

U.S. PATENT DOCUMENTS

| | | | |
|---|---|---|---|
| 10,700,207 | B2 | 6/2020 | Chen |
| 10,734,224 | B2 | 8/2020 | Smith |
| 11,094,594 | B2 | 8/2021 | Tsao |
| 11,881,455 | B2 * | 1/2024 | Park .................. H01L 23/5286 |
| 12,159,869 | B2 * | 12/2024 | Chung ................. H10D 84/038 |
| 2019/0080969 | A1 | 3/2019 | Tsao |
| 2020/0075574 | A1 | 3/2020 | Smith |
| 2020/0105671 | A1 | 4/2020 | Lai |
| 2020/0266169 | A1 | 8/2020 | Kang |
| 2020/0294860 | A1 | 9/2020 | Chang |
| 2020/0373331 | A1 * | 11/2020 | Kim ................. H01L 21/76898 |
| 2020/0411436 | A1 | 12/2020 | Xie |
| 2021/0028112 | A1 * | 1/2021 | Kim ..................... H10D 84/038 |
| 2021/0134721 | A1 | 5/2021 | Chiang et al. |
| 2021/0350062 | A1 | 11/2021 | Yang |
| 2021/0351303 | A1 * | 11/2021 | Ju ..................... H01L 21/76897 |
| 2021/0375722 | A1 * | 12/2021 | Kim ..................... H10D 84/038 |
| 2021/0375861 | A1 | 12/2021 | Chung |
| 2021/0376076 | A1 | 12/2021 | Su |
| 2022/0028758 | A1 | 1/2022 | Song |
| 2022/0037254 | A1 | 2/2022 | Choi |
| 2022/0037496 | A1 | 2/2022 | Chen |
| 2022/0181198 | A1 | 6/2022 | Licausi |
| 2022/0181259 | A1 | 6/2022 | Chiang |
| 2022/0367727 | A1 * | 11/2022 | Chang ................. H10D 64/018 |
| 2023/0032866 | A1 * | 2/2023 | Wei ........................ H10D 84/85 |
| 2023/0386993 | A1 * | 11/2023 | Huang ................ H01L 27/1211 |

FOREIGN PATENT DOCUMENTS

| | | | |
|---|---|---|---|
| TW | 202117859 | A | 5/2021 |
| TW | 202131406 | A | 8/2021 |
| TW | 202414766 | A | 4/2024 |
| WO | 2023/241932 | A1 | 12/2023 |

OTHER PUBLICATIONS

International Searching Authority, "Invitation to Pay Additional Fees and, Where Applicable, Protest Fee", International application No. PCT/EP2023/064687, International Filing Date Jun. 1, 2023, Mailed on Sep. 21, 2023, 9 pages.

"IMEC demonstrates critical building blocks for a backside power delivery network", IMEC, Jun. 10, 2021, 22 pages, <https://www.imec-int.com/en/articles/imec-demonstrates-critical-building-blocks-backside-power-delivery-network>.

Gupta et al., "Buried Power Rail Scaling and Metal Assessment for the 3 nm Node and Beyond", Proceedings of the 2020 IEEE International Electron Devices Meeting (IEDM), Dec. 2020, 4 pages.

Prasad, Divya, "Buried Power Rails and Back-Side Power Grids", Arm Research, Mar. 5, 2020, 6 pages, <https://community.arm.com/arm-research/b/articles/posts/can-we-bury-our-scaling-problems-with-buried-power-rails-and-pack-side-power-delivery>.

* cited by examiner

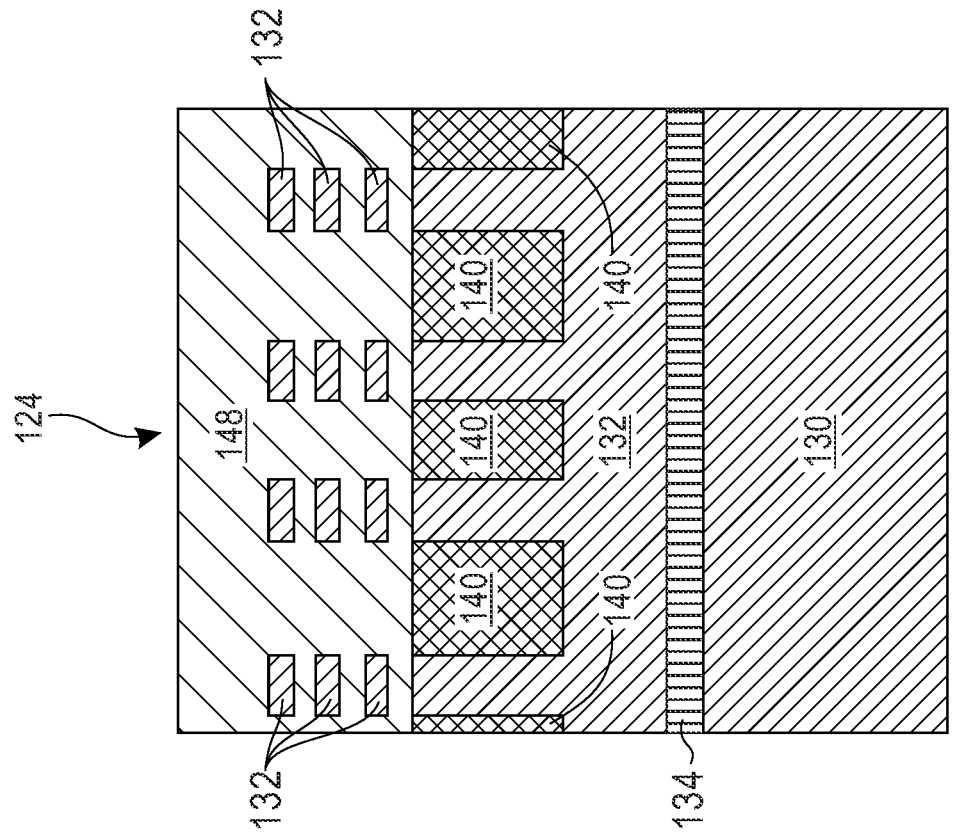
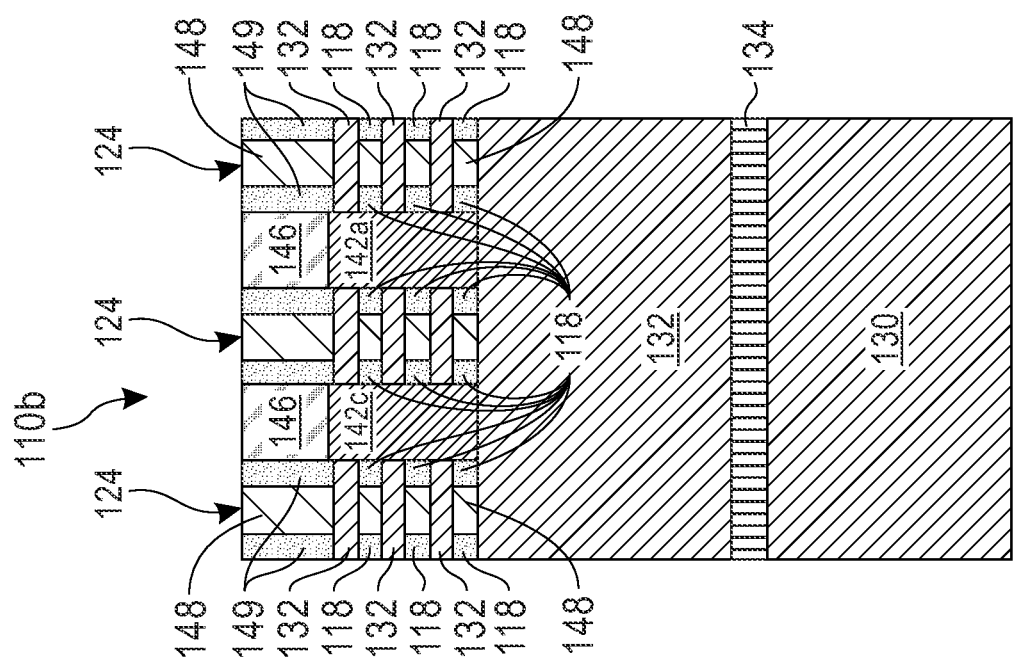
FIG. 5B
FIG. 5A

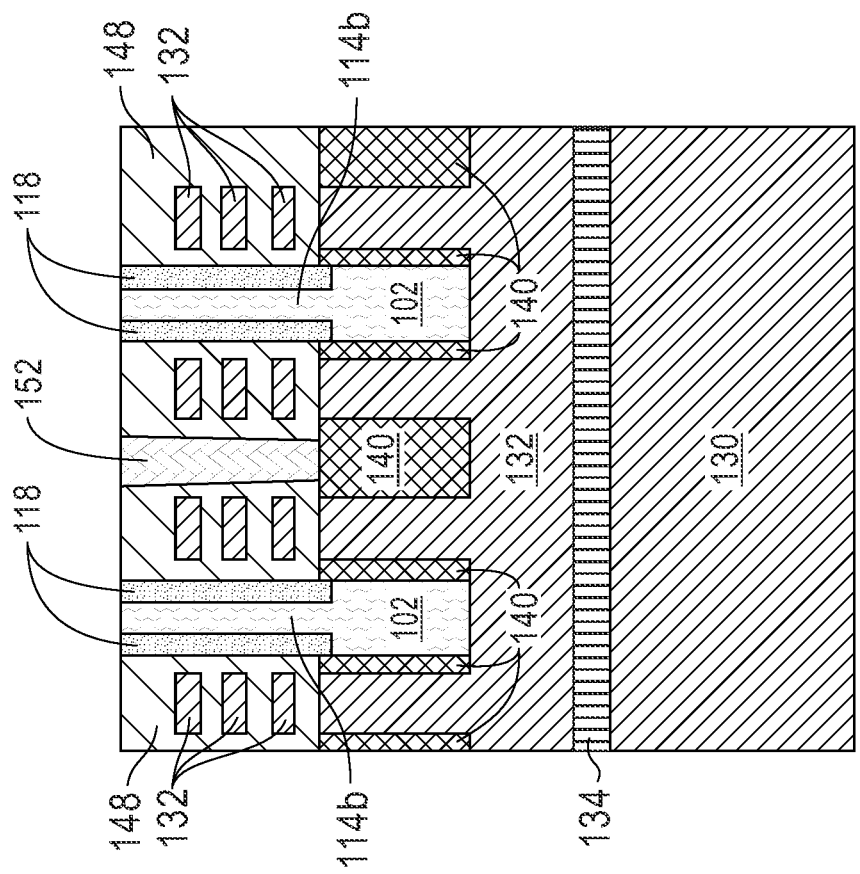
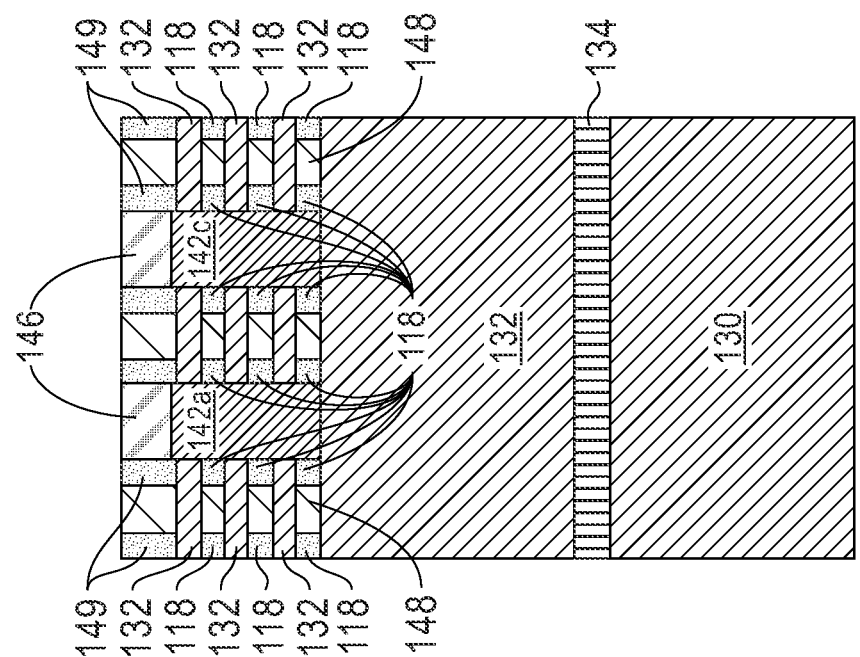
FIG. 8A
FIG. 8B

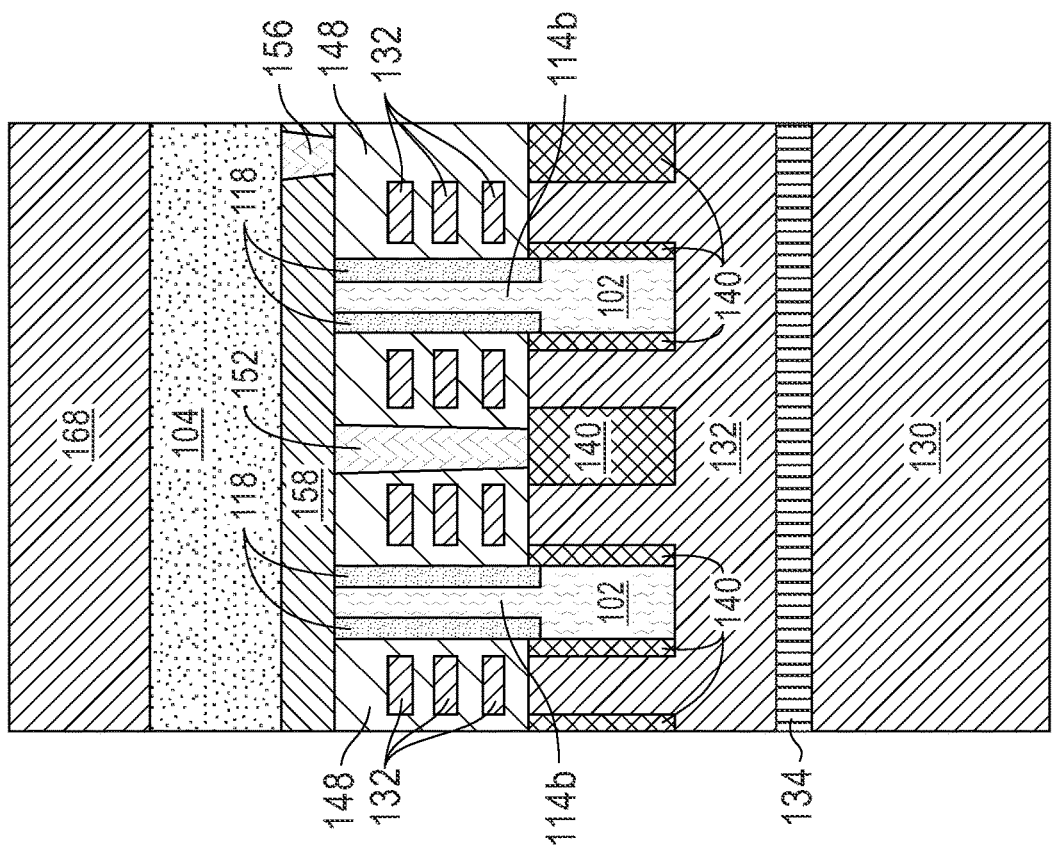
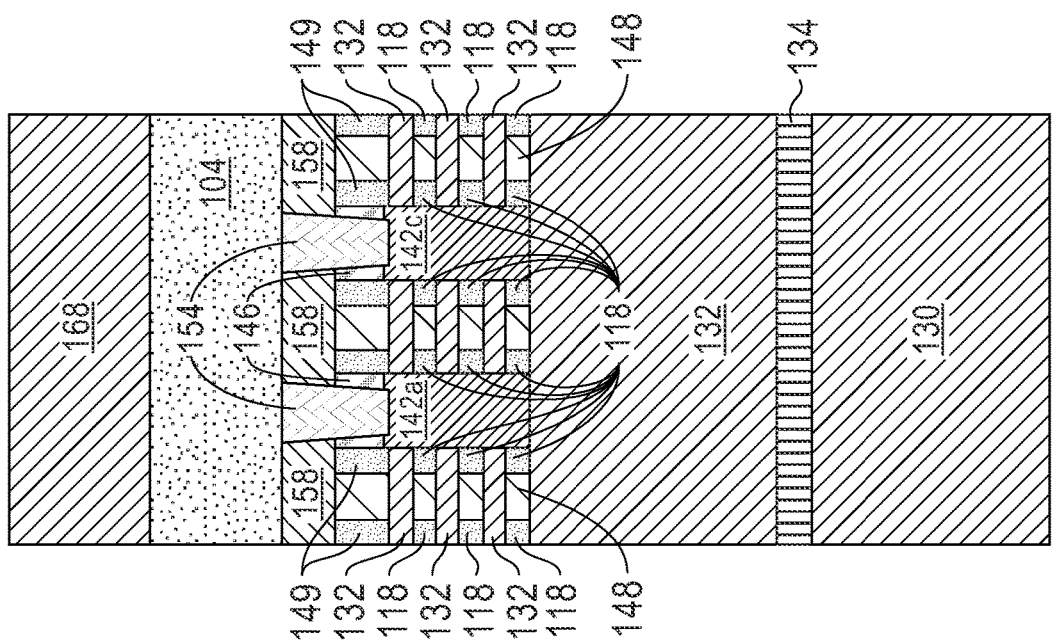
FIG. 10B
FIG. 10A

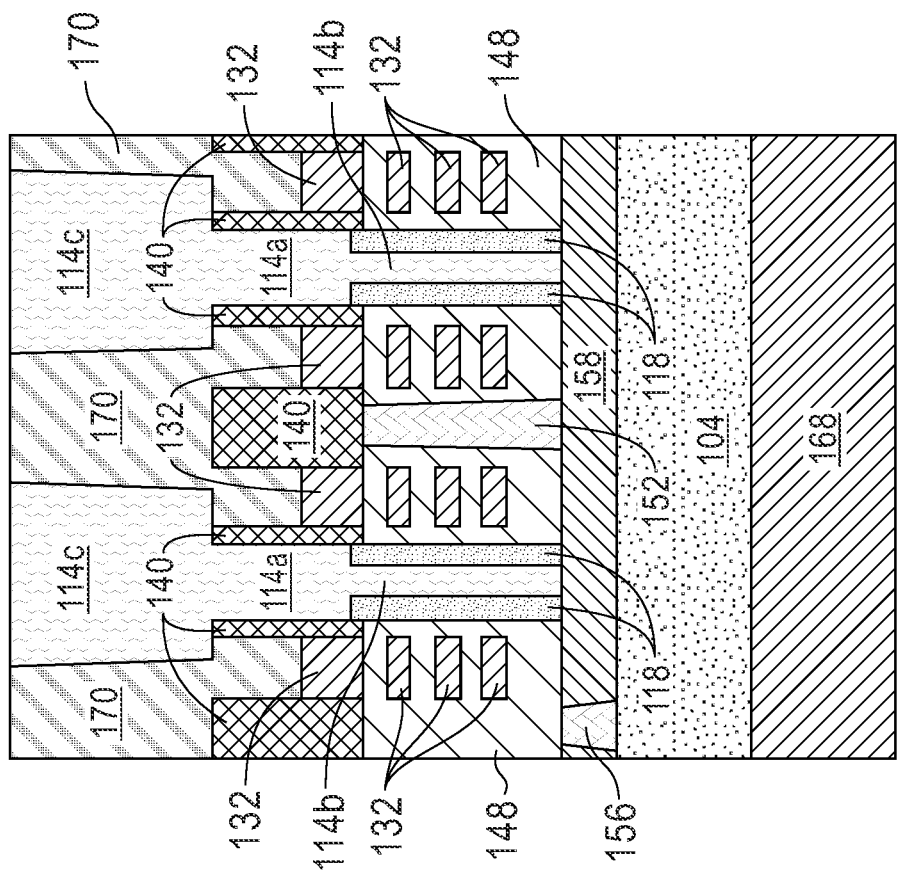
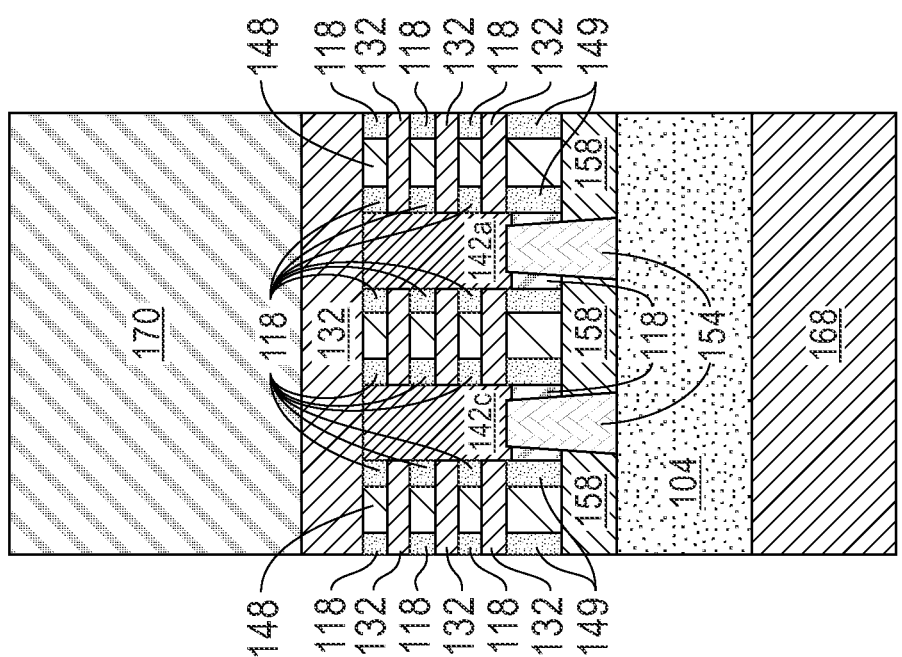
FIG. 12A
FIG. 12B

MULTIPLE CRITICAL DIMENSION POWER RAIL

BACKGROUND

The present invention relates generally to the field of power delivery in a semiconductor structure, and more particularly to power rails having multiple sections with different critical dimensions.

In fabricating semiconductor devices, millions of devices can be located together on a single substrate. Useful control of these millions of devices relies on the application of electrical signals to specific devices while insulting the electrical signals from shorting to anything else (e.g., other devices). Within standard logic cells, power rails in device layers deliver signals to source/drains (S/Ds) that power the individual devices (e.g., transistors). In the fabrication of the power rails, integrated circuits (ICs) may include wires incorporated on a back side, opposite the signal wires of the circuit. These "backside power delivery networks" (BSPDN), and the accompanying separation of the signal delivery (i.e., back-end-of-line (BEOL) network) from the BSPDN, enable more area within the circuit for each delivery system. Furthermore, this separation also enables the transistors in the device layer between the BSPDN and the BEOL to be fabricated closer together.

SUMMARY

Aspects of an embodiment of the present invention include a semiconductor structure. The semiconductor structure may include a first transistor device on a substrate, a second transistor device on the substrate, and a power rail between the first transistor device and the second transistor device. The power rail may include a first section with a first critical dimension (CD), a second section with a second CD, and a third section with a third CD.

Aspects of an embodiment of the present invention include a method of fabricating a semiconductor structure. The method may include forming a deep gate cut between a first transistor device and a second transistor device of a substrate, forming a first section of a power rail in the deep gate cut, forming an inner spacer in the deep gate cut above the first section, forming a second section of the power rail between the inner spacer, and forming a third section of the power rail below the first section.

Aspects of an embodiment of the present invention include a semiconductor structure. The semiconductor structure may include a power rail electrically connected between a first source/drain (S/D) of a first transistor device and a backside power delivery network (BSPDN). The power rail may include a first section with a first critical dimension (CD), a second section with a second CD, and a third section with a third CD.

BRIEF DESCRIPTION OF THE DRAWINGS

FIG. 5A, 5B, 5C depict cross-sectional side views of the semiconductor structure of FIG. 1 at a fabrication stage, in accordance with one embodiment of the present invention.

FIG. 8A, 8B, 8C depict cross-sectional side views of the semiconductor structure of FIG. 1 at a fabrication stage, in accordance with one embodiment of the present invention.

FIG. 10A, 10B, 10C depict cross-sectional side views of the semiconductor structure of FIG. 1 at a fabrication stage, in accordance with one embodiment of the present invention.

FIG. 12A, 12B, 12C depict cross-sectional side views of the semiconductor structure of FIG. 1 at a fabrication stage, in accordance with one embodiment of the present invention.

DETAILED DESCRIPTION

Figure 1:
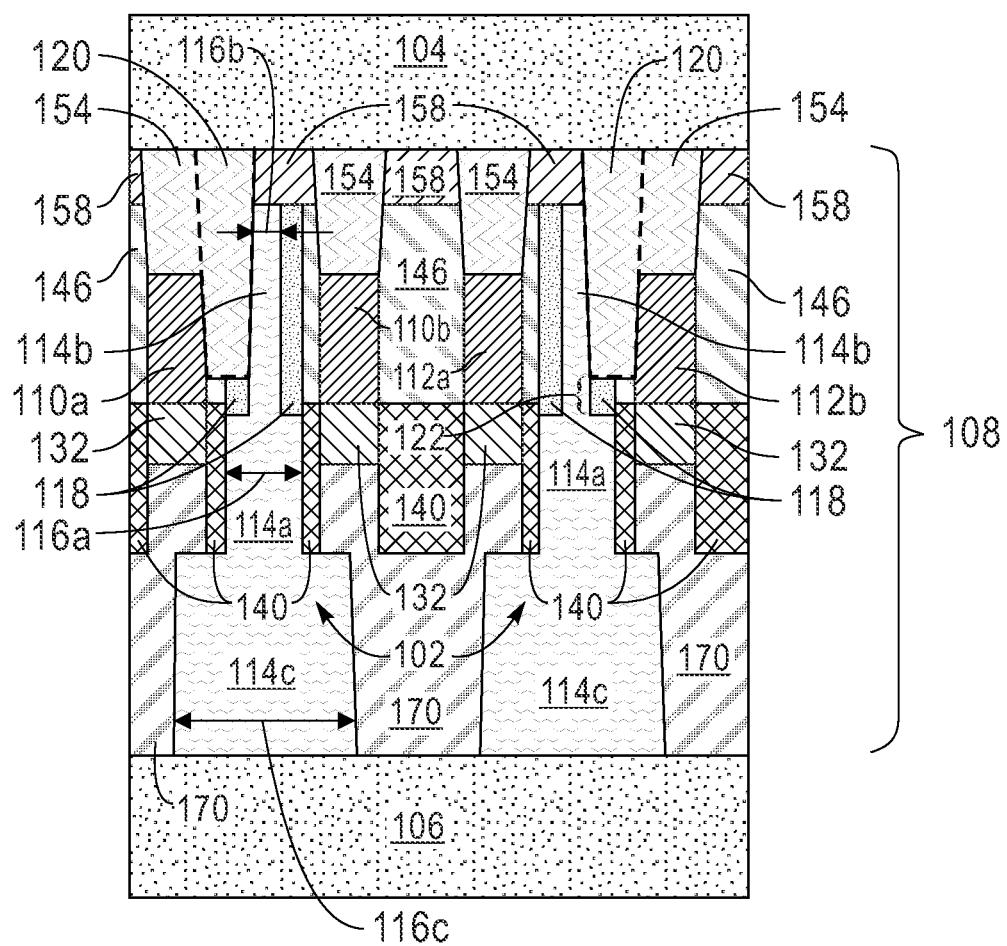
FIG. 1 depicts a cross-sectional side view of a semiconductor structure having a power rail, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical, and electrical changes may be made without departing from the described embodiments. The following detailed description is, therefore, not to be taken in a limiting sense, and the included embodiments are defined by the appended claims.

Embodiments disclosed herein recognize that source/drains (S/D) in an integrated circuit (IC) can have contacts that require a connection such as a power rail that passes from a top side of the S/D to the backside power delivery network (BSPDN). The power rails carry a higher current than standard routing tracks/signal lines to maintain adequate power distribution targets, which can limit scaling for integrated circuits. That is, as integrated circuits get increasingly more compact, the power rails can become too small to allow the higher current to pass through without significant IR loss. Specifically, the distance from the top of the S/D to the BSPDN divided by the distance (i.e., the small desired distance in the compact design) between the S/Ds defines an aspect ratio for the power rails that increases the resistance between the S/D and the BSPDN.

The embodiments disclosed herein, therefore, include a power rail fabricated with multiple sections which can increase the critical dimension (CD) and decrease the resistance between S/Ds and the BSPDN of the IC. One of the sections, for example, may have a small CD as required by the distance between the S/Ds, but other sections of the power rail may have a bigger CD. CD, as used herein, means a distance measuring the size of a feature on an integrated circuit or transistor that impacts the electrical properties of the IC or transistor. For example, the CD of a transistor may affect the resistance of the transistor.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. Each reference number may refer to an item individually or collectively as a group. For example, a power rail 102 may refer to a single power rail 102 or multiple power rails 102.

The present invention will now be described in detail with reference to the Figures.

FIG. 1 depicts a schematic cross-sectional side view of a semiconductor structure 100 having a power rail 102, in accordance with one embodiment of the present invention. The power rail 102 is electrically connected between a middle of line (MOL) contact 154 and a backside power delivery network (BSPDN) 106. The power rail 102 is in line with a device region 108 that includes transistors and interconnects comprising contacts wiring the transistors in the device region 108 to the BEOL layers 104, and contacts wiring the transistors in the device region 108 to BSPDN 106. The BEOL layers 104, the BSPDN 106, and the device region 108 are all not necessarily drawn to scale. The device region 108 may include separated NFET regions 110a, b and PFET regions 112a, b arranged in rows and columns containing thousands or millions of transistors. In certain embodiments, the device region 108 is fabricated in one vertical orientation (and completed) before the semiconductor structure 100 is flipped over with the third section 114c of power rails 102 and the BSPDN 106 being fabricated in the opposite vertical orientation. The process of fabrication and flipping the semiconductor structure 100 is explained in detail below.

The power rails 102 may include multiple sections to reduce the length at which the power rails 102 have a small critical dimension (CD). In the embodiment illustrated in FIG. 1, the power rails 102 have three sections: a first section 114a with a first CD 116a, a second section 114b with a second CD 116b, and a third section 114c with a third CD 116c. The second section 114b has the smallest CD due to the presence of an inner spacer 118 on either side of the second section 114b, but the signal passing through the second section 114b also flows through a contact via 120 that contacts the second section 114b over a majority of the second section 114b. The power rail 102, therefore, only has a small region 122 through which the signal passes through a restricted or narrow path.

Figure 2:
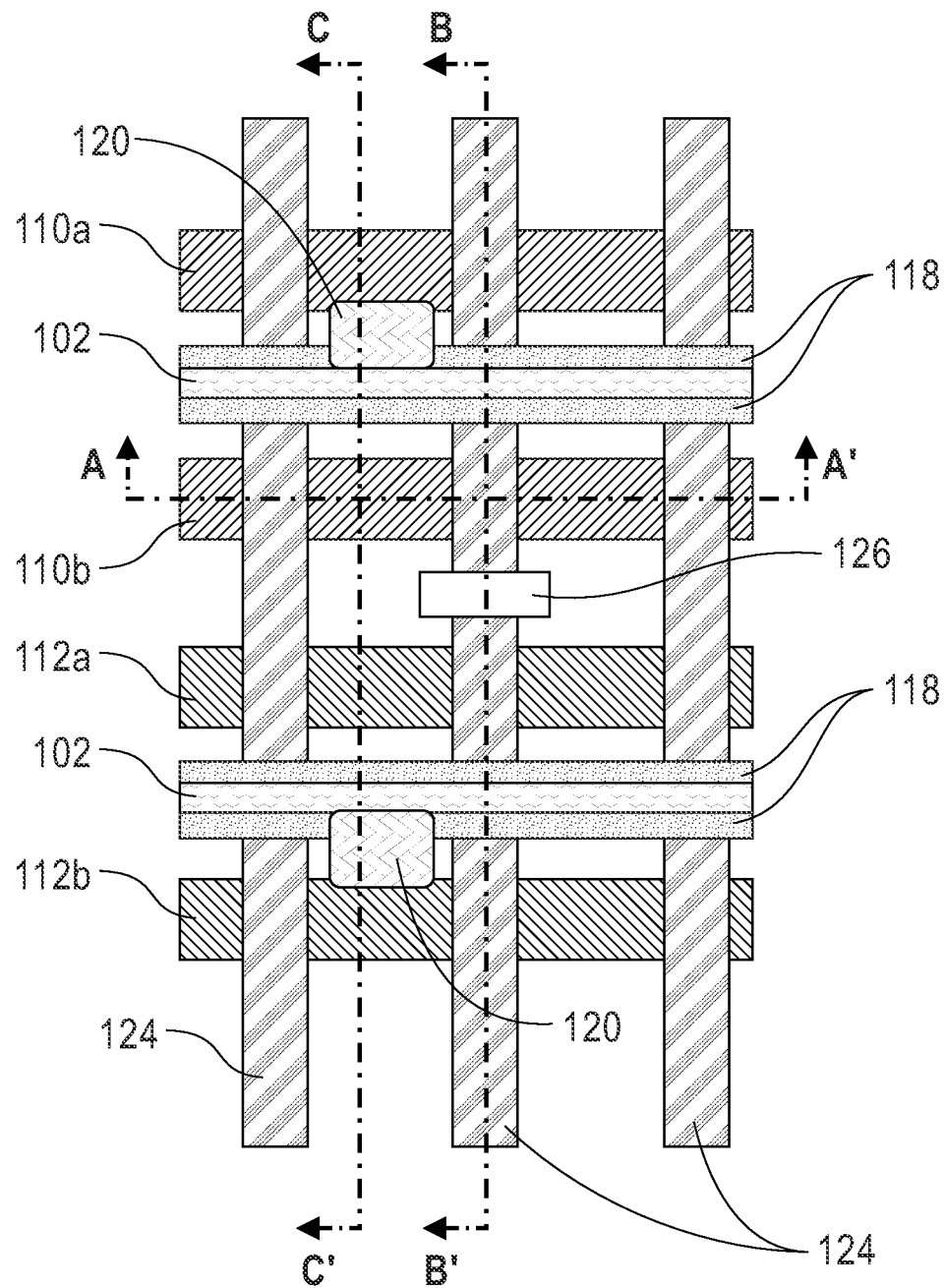
FIG. 2 depicts a cross-sectional top view of the semiconductor structure of FIG. 1, in accordance with one embodiment of the present invention.

FIG. 2 is a cross-sectional top view of the semiconductor structure 100 of FIG. 1, in accordance with one embodiment of the present invention. The semiconductor structure 100 shows the power rails 102 as fitting in between the rows of NFET regions 110a, b and between rows of PFET regions 112a, b. The semiconductor structure 100 also includes columns of gates 124. The gates 124, in certain embodiments, may be separated from each other by a shallow gate cut 126, which may be located at varied locations according to specific designs for the circuit of the semiconductor structure 100. The power rails 102 are separated from the gates 124 by the inner spacer 118, which is replaced by the contact via 120 at specific locations according to the design of the circuit. The contact via 120 enables the power rail 102 to electrically connect to source/drains in the NFET region 110a and the PFET region 112b.

Figure 4:
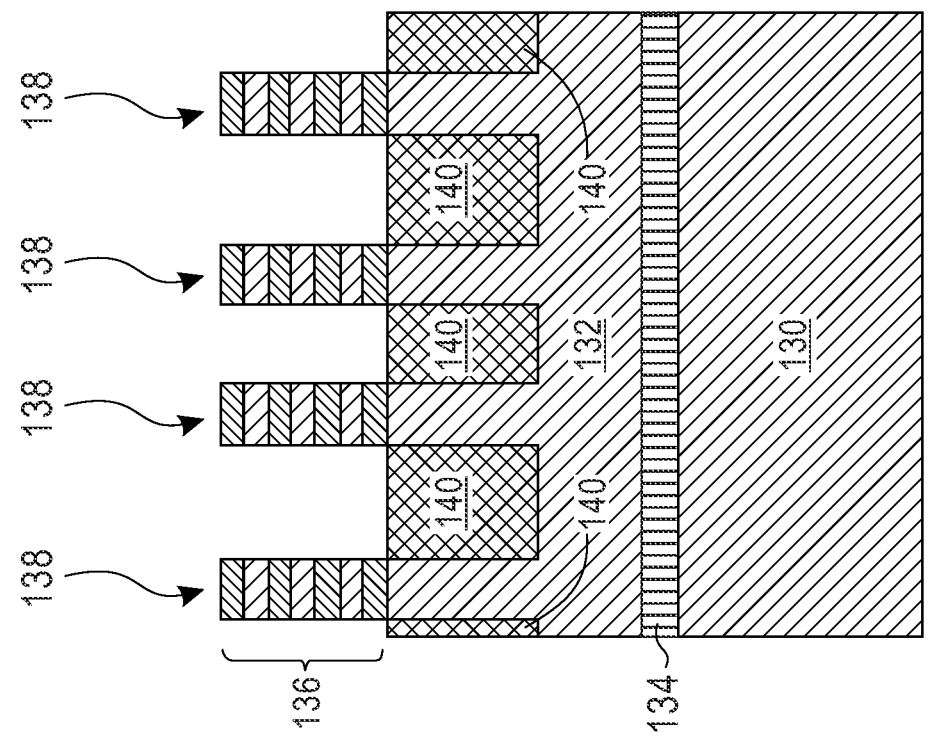
FIG. 4 depicts cross-sectional side views of the semiconductor structure of FIG. 1, in accordance with one embodiment of the present invention.
Figure 3:
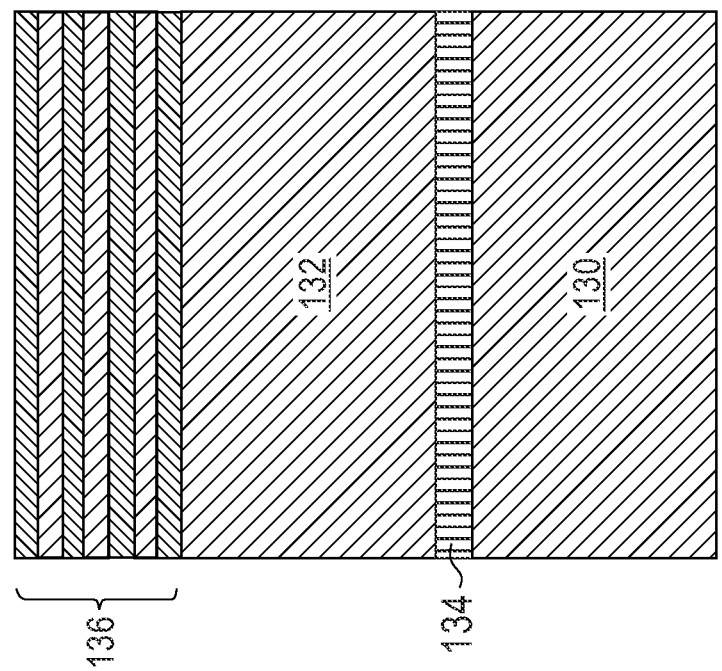
FIG. 3 depicts cross-sectional side views of the semiconductor structure of FIG. 1, in accordance with one embodiment of the present invention.

The fabrication process for the power rails 102 will now be described. In the figures below each "A" figure is a cross-sectional view along line A-A', each "B" figure is a cross-sectional view along line B-B', and each "C" figure is a cross-sectional view along line C-C'. FIGS. 3 and 4 are cross-sectional views along line B-B' of FIG. 2.

FIG. 3 is a cross-sectional side view of the semiconductor structure 100 at a fabrication step, in accordance with one embodiment of the present invention. FIG. 3 is a view of the semiconductor structure 100 formed on a structural substrate 130 that is separated from a silicon substrate 132 by an etch stop layer 134. Above the silicon substrate 132, the semiconductor structure 100 includes nanosheet layers 136 that form the transistors. The nanosheet layers 136 may be fabricated by forming epitaxial semiconductor layers sequentially above the bottom-most semiconductor layer above the silicon substrate 132. For example, a layer of silicon and a layer of BOX SiO2 may be fabricated above the silicon substrate 132. Then the layers may be converted into alternating SiGe and Si layers by growing a SiGe layer through a condensation process to convert the bottom most semiconductor layer above the silicon substrate 132 to SiGe. After that, the oxide above the SiGe is removed, followed by alternative layers of Si and SiGe layer growth. Other methods may be used to form the nanosheet layers 136. Certain embodiments may also include other forms of transistors.

FIG. 4 is a schematic cross-sectional side view of the semiconductor structure 100 at a fabrication step, in accordance with one embodiment of the present invention. FIG. 4 is a view of the semiconductor structure 100 after a hard mask (not pictured) is deposited and patterned to form fins 138. A patterning process is applied to the hard mask to define the active regions by conventional lithographical and etch processes. Then the area of the nanosheet layers 136 that are not protected by the hard mask may be etched away to form the fins 138. The open spaces between the fins 138 may be filled with shallow trench isolation (STI) 140, which may be etched back to reveal the fins 138. Certain embodiments may be fabricated by depositing the STI 140 only in the open spaces below the nanosheet layers 136.

Figure 5C:
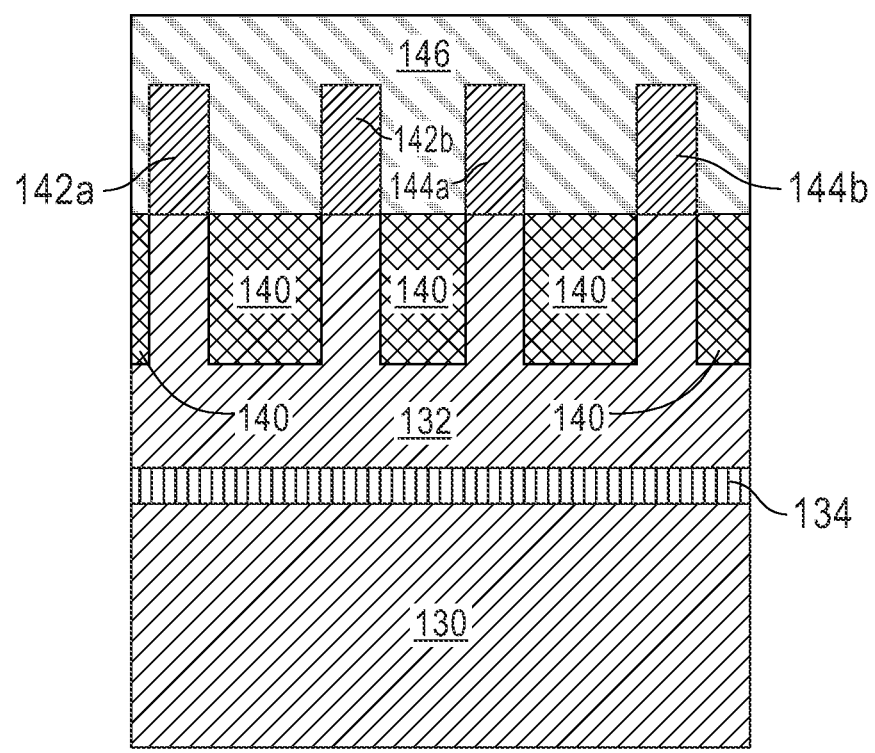

FIGS. 5A, 5B, and 5C are cross-sectional side views of the semiconductor structure 100 at a fabrication step, in accordance with one embodiment of the present invention. As mentioned above, FIG. 5A is a cross-sectional view along line A-A', FIG. 5B is a cross-sectional view along line B-B', and FIG. 5C is a cross-sectional view along line C-C'. The front-end-of-line devices (FEOL) of the NFET regions 110a, b and the PFET regions 112a, b may be fabricated with NFET source/drains (S/D) 142a, b, c, PFET S/Ds 144a, b, and gates 124 using conventional FEOL transistor fabrication methods. The nanosheet layers 136 may be laterally cut in a direction parallel to FIG. 5A and perpendicular to FIGS. 5B and 5C. The open spaces between the NFET regions 110a, b and the PFET regions 112a, b may then be filled with dielectric 146, such as a non-crystalline solid material (e.g., SiN, SiC, SiCN(H)), or other silicon compounds for insulating, silicon dioxide (SiO2), undoped silicate glass (USG), tetraethyl orthosilicate (TEOS), low-κ dielectric, or ultra low-κ dielectric materials, fluorosilicate glass (FSG), borophosphosilicate glass (BPSG), a spin-on low-κ dielectric layer, a chemical vapor deposition (CVD) low-κ dielectric layer or any combination thereof. The gates 124 may include a high-κ metal gate (HKMG) 148 and inner spacers 149 surrounding the nanosheet layers 136. The semiconductor structure 100 may then be planarized, for example with chemical-mechanical planarization (CMP).

Figure 6A:
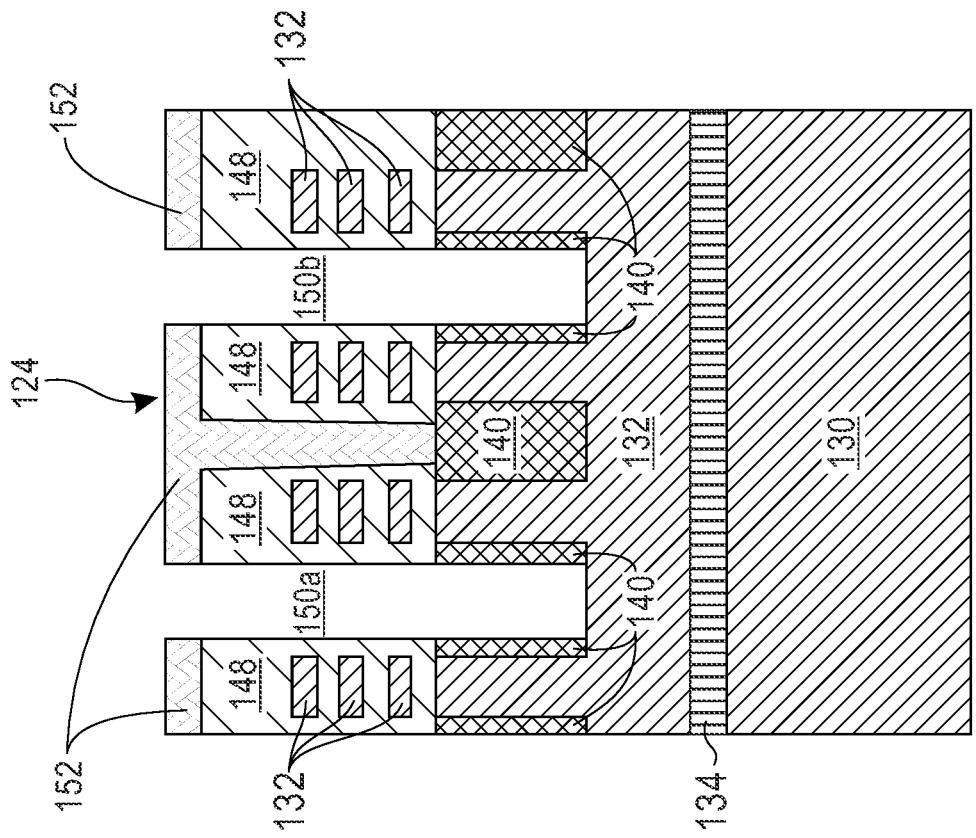
FIG. 6A, 6B, 6C depict cross-sectional side views of the semiconductor structure of FIG. 1 at a fabrication stage, in accordance with one embodiment of the present invention.
Figure 6B:
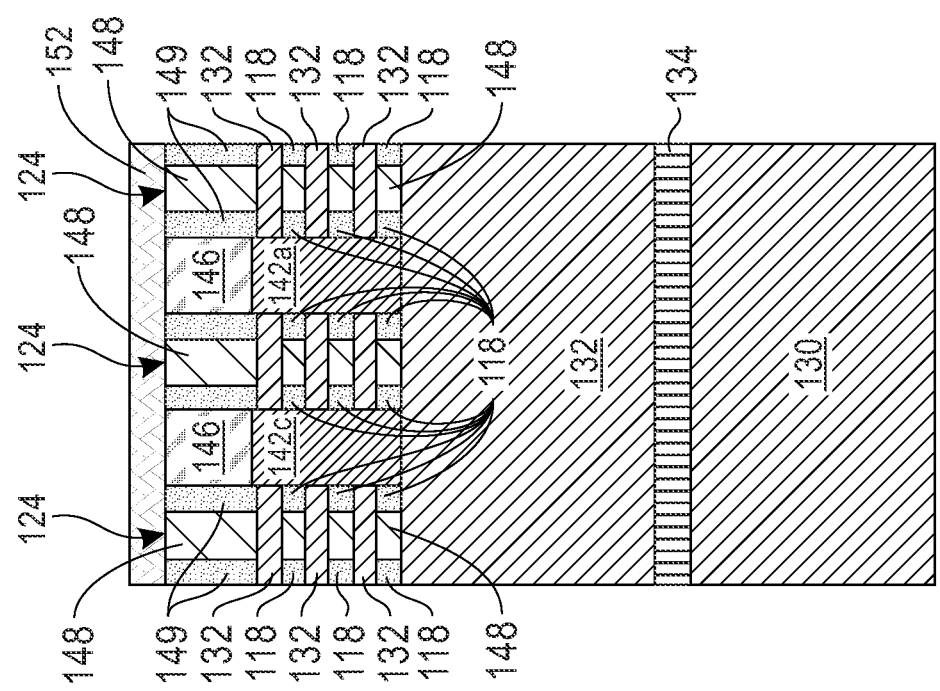
Figure 6C:
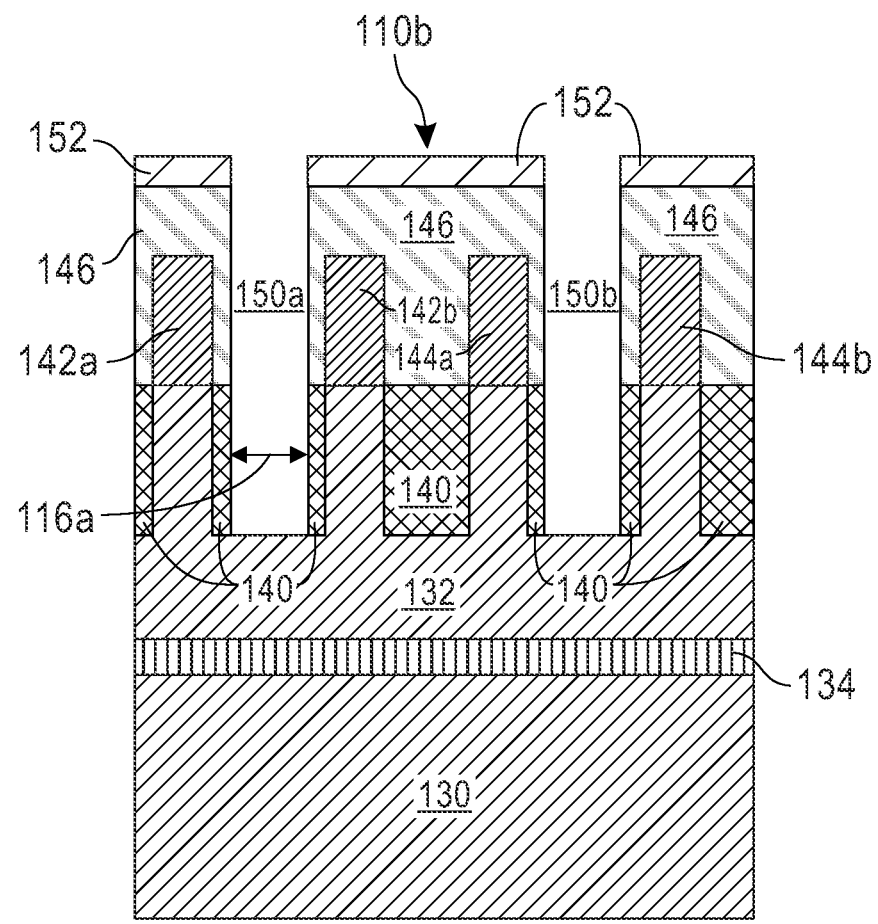

FIGS. 6A, 6B, and 6C are cross-sectional side views of the semiconductor structure 100 at a fabrication step, in accordance with one embodiment of the present invention. The semiconductor structure 100 includes a first deep gate cut 150a between the NFET regions 110a, b, and a second deep gate cut 150b between the PFET regions 112b. The semiconductor structure 100 also includes a shallow gate cut 152. The deep gate cuts 150a, b and shallow gate cut 152 may be patterned using a conventional lithographical and etch process, and may be patterned using one hard mask (not illustrated) for the deep gate cuts 150a, b and another hard mask (not illustrated) for the shallow gate cut 152. Each hard mask may be patterned (e.g., using lithography and etch processes) so that the deep gate cuts 150a, b may be subsequently formed through an etching process. In some embodiments, this etching can be performed using an anisotropic etch such as reactive ion etching (RIE). The deep gate cuts 150a, b may be etched through the dielectric 146 and the STI 140, and in certain embodiments may partially cut into the silicon substrate 132. The deep gate cuts 150a, b may be etched with the first CD 116a, which is wider than would typically be used between the S/Ds 142a, b, 144a, b. The first CD 116a can be larger because the first CD 116a is only used at the level of the STI 140, as shown in the subsequent steps below. The shallow gate cut 152 is an optional component that is etched between some NFET regions 110a, b and the PFET regions 112a, b of the semiconductor structure 100, but in other locations, NFETs may border PFETs without a shallow gate cut 152.

Figure 7A:
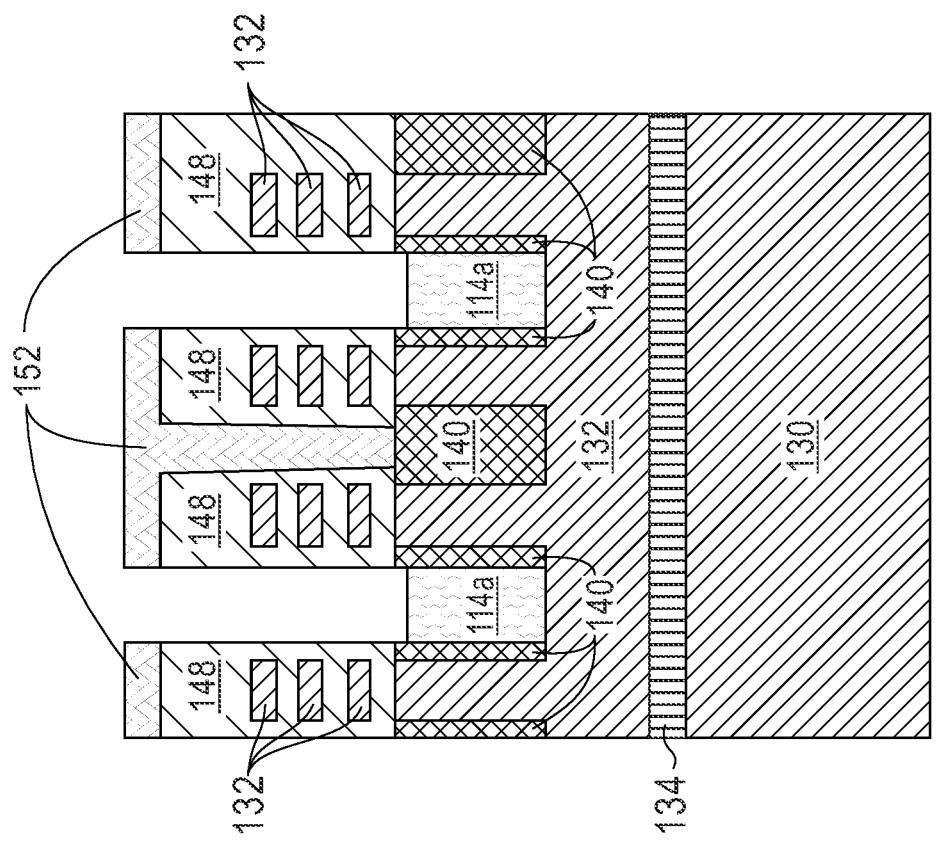
FIG. 7A, 7B, 7C depict cross-sectional side views of the semiconductor structure of FIG. 1 at a fabrication stage, in accordance with one embodiment of the present invention.
Figure 7B:
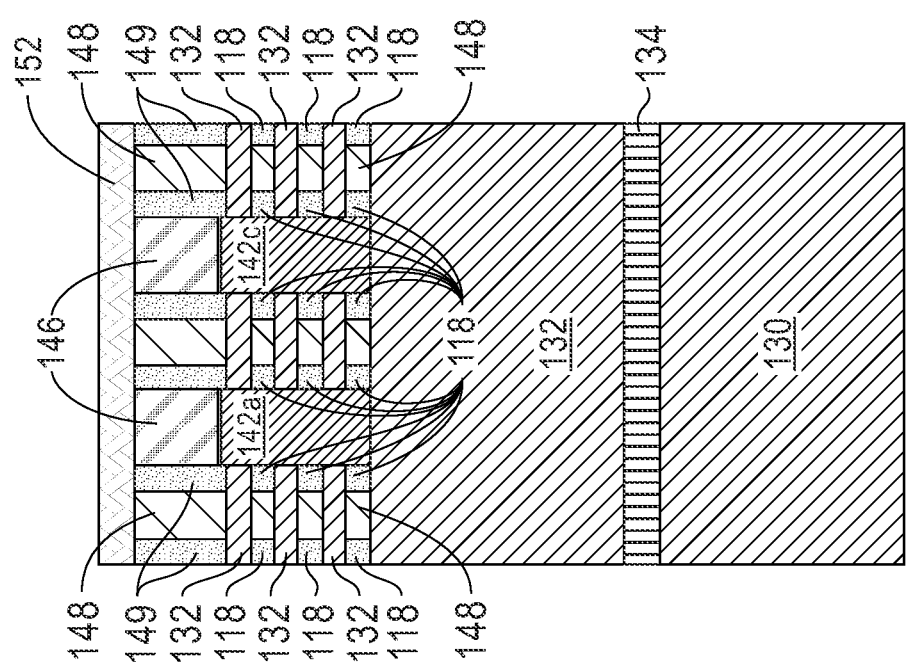
Figure 7C:
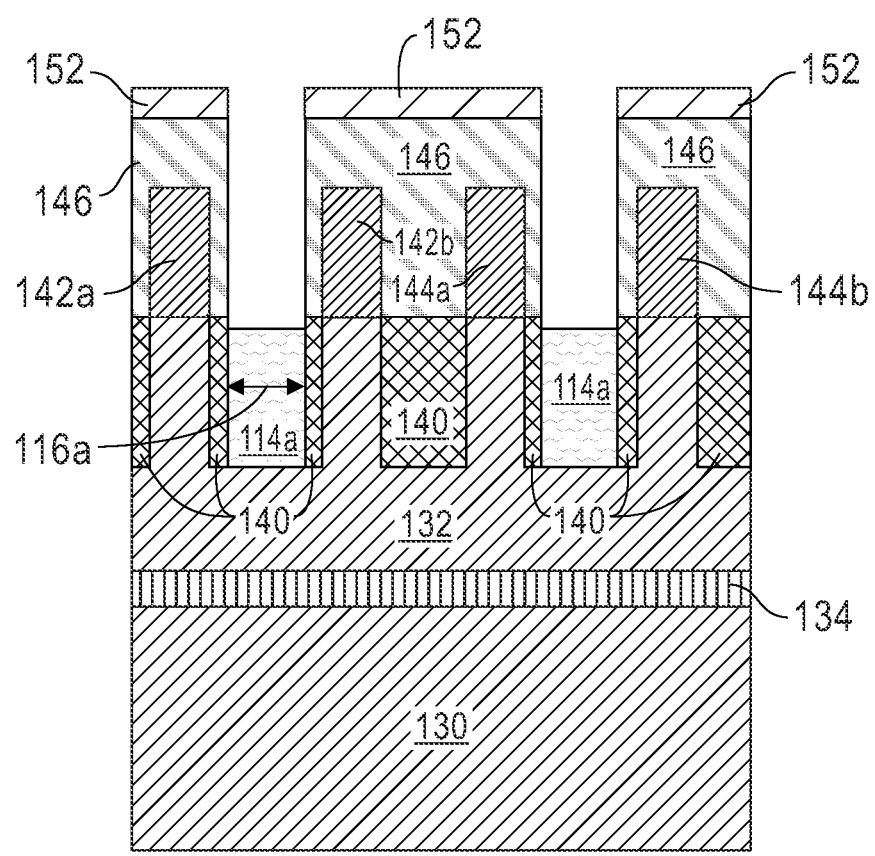

FIGS. 7A, 7B, and 7C are cross-sectional side views of the semiconductor structure 100 at a fabrication step, in accordance with one embodiment of the present invention. The semiconductor structure 100 includes the first section 114a of the power rail 102 formed at the bottom of the deep gate cut 150. The first section 114a may be formed by uniformly depositing a metal on the semiconductor structure 100 and afterward pulling the metal back using a directional etch technique. The first section 114a includes metal formed fully across the first CD 116a. Thus, the first section 114a includes metal that is bounded by the STI 140. As used herein, bounded by the STI 140 means that the first section 114a extends in a lateral direction until the metal directly contacts the STI 140. The first CD 116a, in certain embodiments, is 20 nm. Other embodiments may include a first CD 116a that is between 15 nm and 25 nm, or other ranges to provide a wide and low-resistance path for signals to travel through the power rail 102.

Figure 8C:
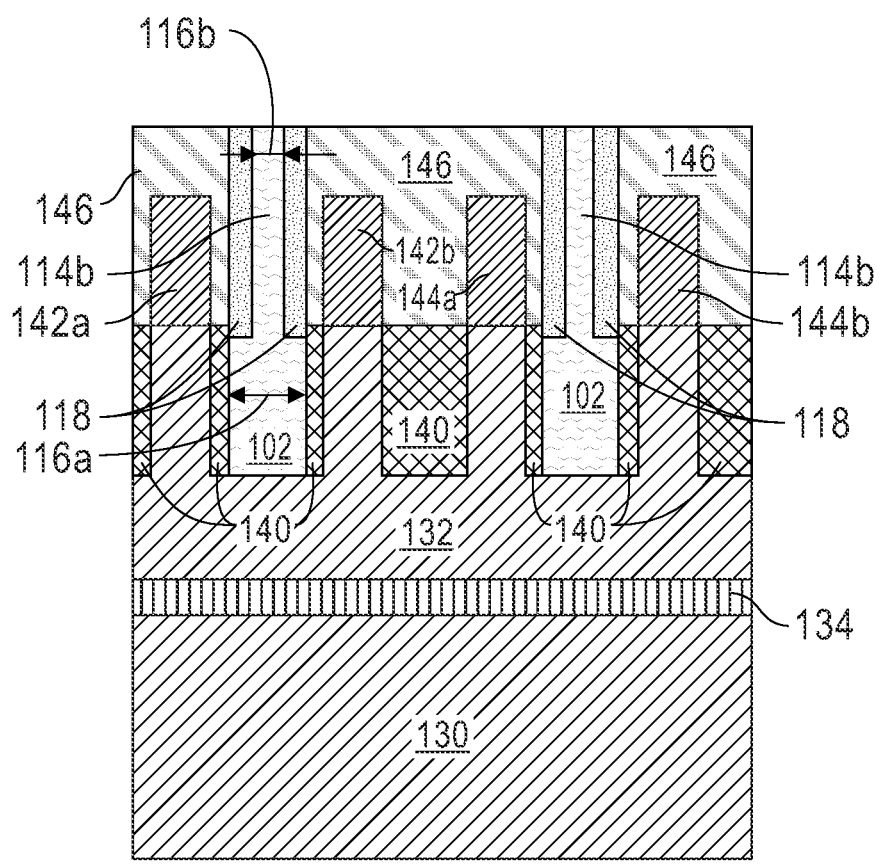

FIGS. 8A, 8B, and 8C are cross-sectional side views of the semiconductor structure 100 at a fabrication step, in accordance with one embodiment of the present invention. The semiconductor structure 100 includes the inner spacer 118 lining the deep gate cut 150 above the first section 114a and the second section 114b of the power rail 102. The inner spacer 118 insulates the second section 114b from the gates 124 and the S/Ds 142, 144 since there is a potential to short from the metal of the power rail 102. The inner spacer 118 may be fabricated using a blanket layer of dielectric material followed by a directional etch process whereby the dielectric material is etched from the horizontal surfaces of the semiconductor structure 100. Likewise, the second section 114b may be fabricated by depositing metal over the semiconductor structure 100 and removing the excess material. The semiconductor structure 100 may subsequently be planarized using, for example, chemical-mechanical planarization (CMP).

The second section 114b is fabricated with the second CD 116b bounded by the inner spacer 118. The second CD 116b may be the smallest of the three CDs 116a, b, c since the second CD 116b is fabricated between the gates 124 and the S/Ds 142, 144. The second CD 116b in certain embodiments, is 8 nm. Other embodiments may include a second CD 116b that is between 6 nm and 12 nm, or other ranges that enable the second section 114b to fit between the NFET regions 110a, b or PFET regions 112a, b without shorting to the gates 124 or the S/Ds 142, 144, and still enabling signals to travel through the power rail 102.

Figure 9B:
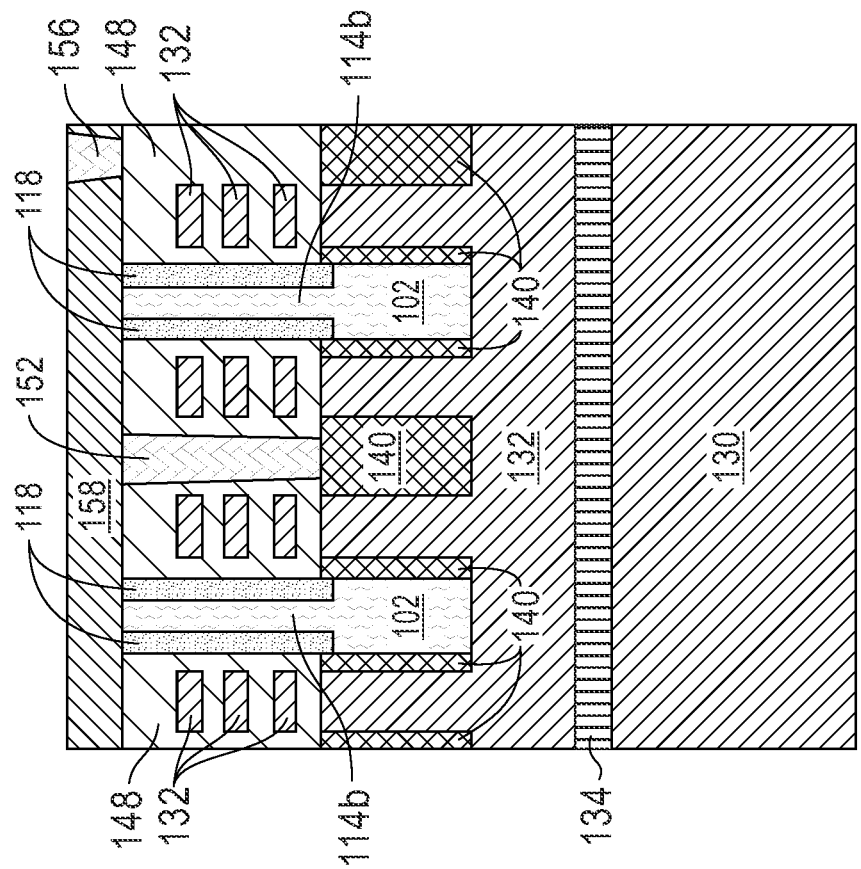
FIG. 9A, 9B, 9C depict cross-sectional side views of the semiconductor structure of FIG. 1 at a fabrication stage, in accordance with one embodiment of the present invention.
Figure 9A:
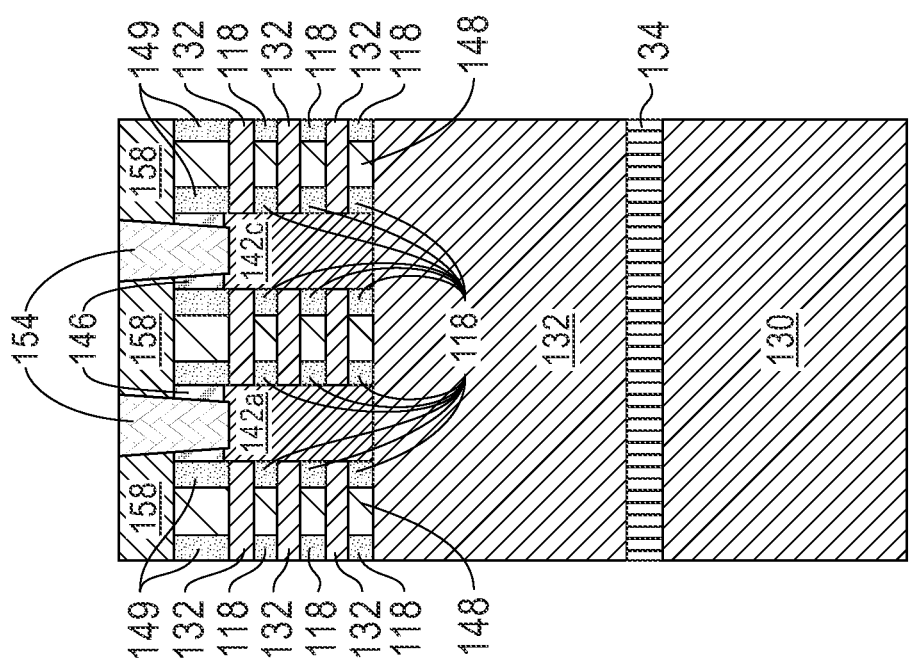
Figure 9C:
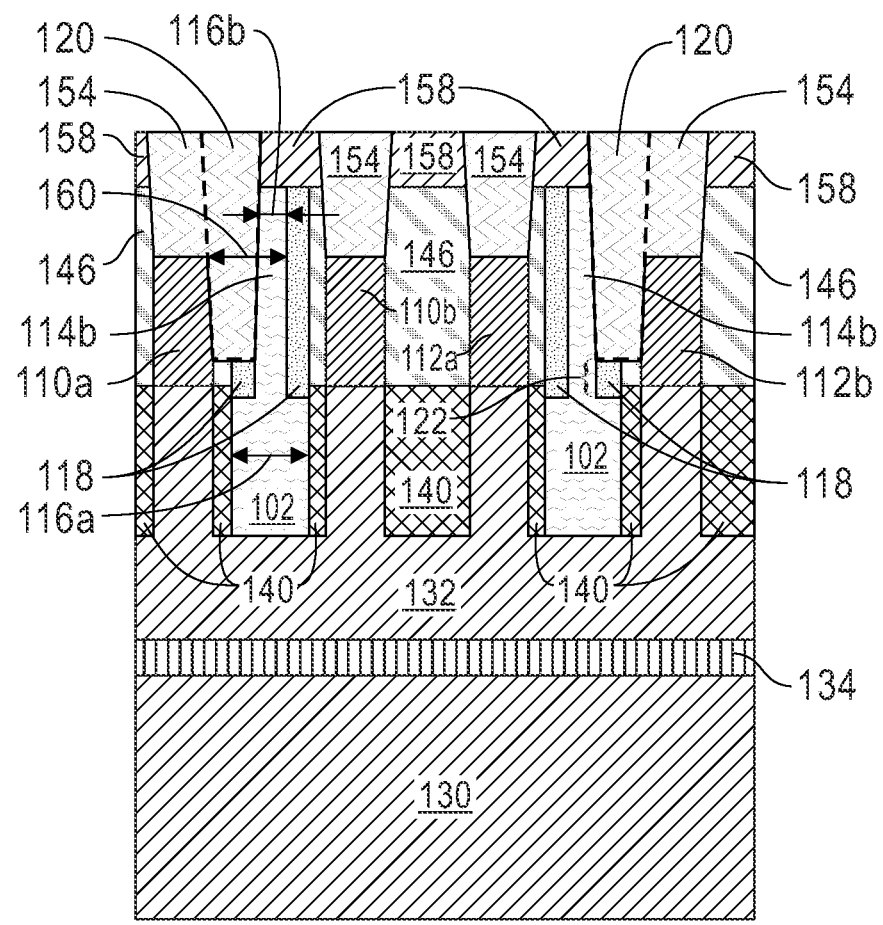

FIGS. 9A, 9B, and 9C are cross-sectional side views of the semiconductor structure 100 at a fabrication step, in accordance with one embodiment of the present invention. The semiconductor structure 100 includes S/D contacts 154, gate contacts 156, and the contact vias 120 fabricated through a middle-of-line interlayer dielectric (MOL ILD) 158. The contacts 154, 156 and contact vias 120 may be fabricated in one or multiple masks. In certain embodiments, the MOL ILD 158 is applied over the planarized semiconductor structure 100, and then a hard mask (not shown) is applied for forming only the contact vias 120. That is, a hard mask is applied and lithographically patterned with holes for the contact vias 120. Then an etch process forms holes in the dielectric 146 and the inner spacer 118 for the contact vias 120, and the holes are filled with a conductive material. The process may then be repeated for the S/D contacts 154 and the gate contacts 156. Certain embodiments may also form subsets of the S/D contacts 154 with different masks (e.g., forming the contacts for the PFET S/Ds 144 before the NFET S/Ds 142 or vice versa).

The contact vias 120 directly connect to the second section 114b of the power rail 102 so that power can easily flow from the power rails 102 to the first NFET region 110a and the second PFET region 112b. The position and connection with the second section 114b enables an effective CD 160 that is larger than the second CD 116b for a majority of the second section 114b. As mentioned above, any power that passes through the power rail 102 is restricted to the second CD 116b only at the small region 122. Therefore, the increased resistance and IR loss that could result from small pitch between the NFET regions 110a, b and the PFET regions 112a, b is reduced.

Figure 10C:
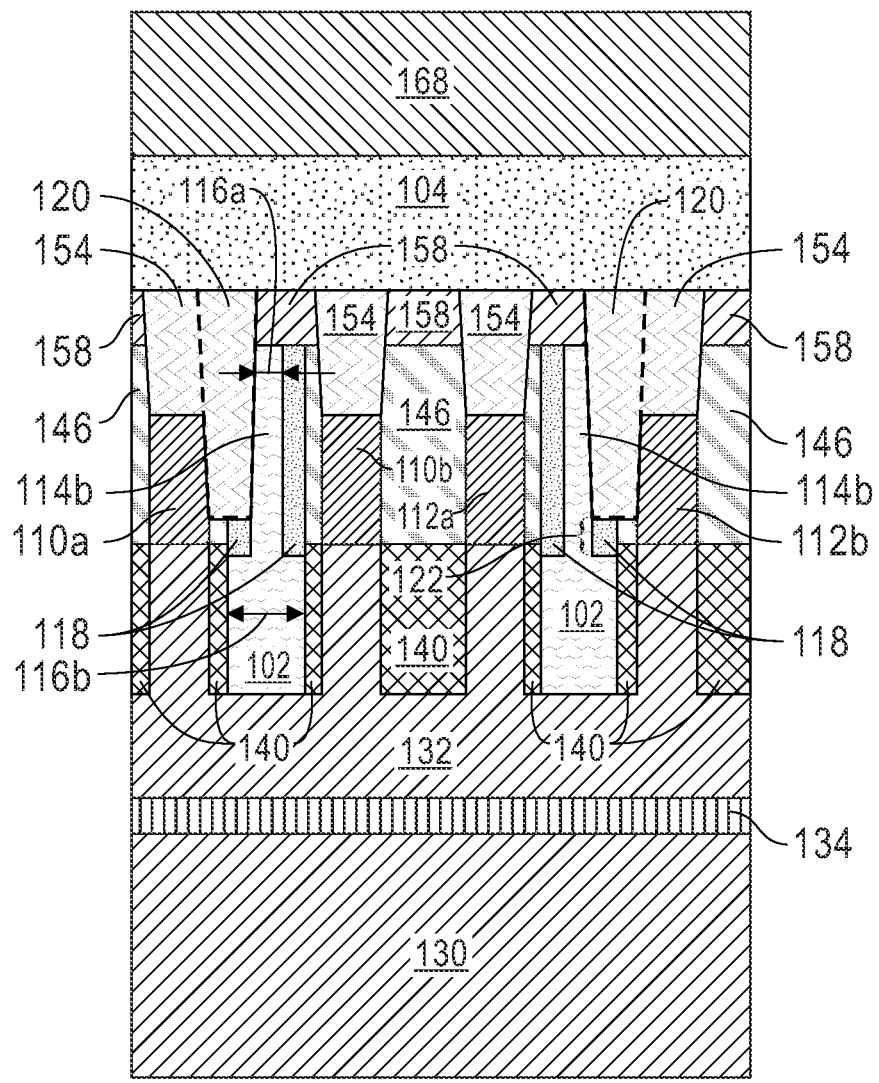

FIGS. 10A, 10B, and 10C are cross-sectional side views of the semiconductor structure 100 at a fabrication step, in accordance with one embodiment of the present invention. The semiconductor structure 100 includes additional of middle-of-line (MOL) and/or back-end-of-line (BEOL) layers 104 and a carrier wafer 168 bonded to a top surface of the MOL/BEOL layers 104. The MOL/BEOL layers 104 include the signal wires for controlling the NFET regions 110a, b and PFET regions 112a, b through the S/D contacts 154. The signal wires may also control a subset of the S/D contacts 154. That is, some of the S/D contacts 154 may be connected to a power delivery network (e.g., the BSPDN 106 shown in FIG. 1) and not be connected to the MOL/BEOL layers 104 for signal processing.

The MOL/BEOL layers 104 include contacts, insulating layers (dielectrics), metal levels, and bonding sites for chip-to-package connections. While the illustrated embodiment is not drawn to scale, modern processes for fabricating the MOL/BEOL layers 104 may include more than ten metal layers. The carrier wafer 168 is bonded to enable the wafer flip and backside processing, including the steps illustrated below. In certain embodiments, the carrier wafer 168 may be bonded to the MOL/BEOL layers 104 through dielectric-dielectric bonding or Cu—Cu bonding.

Figure 11A:
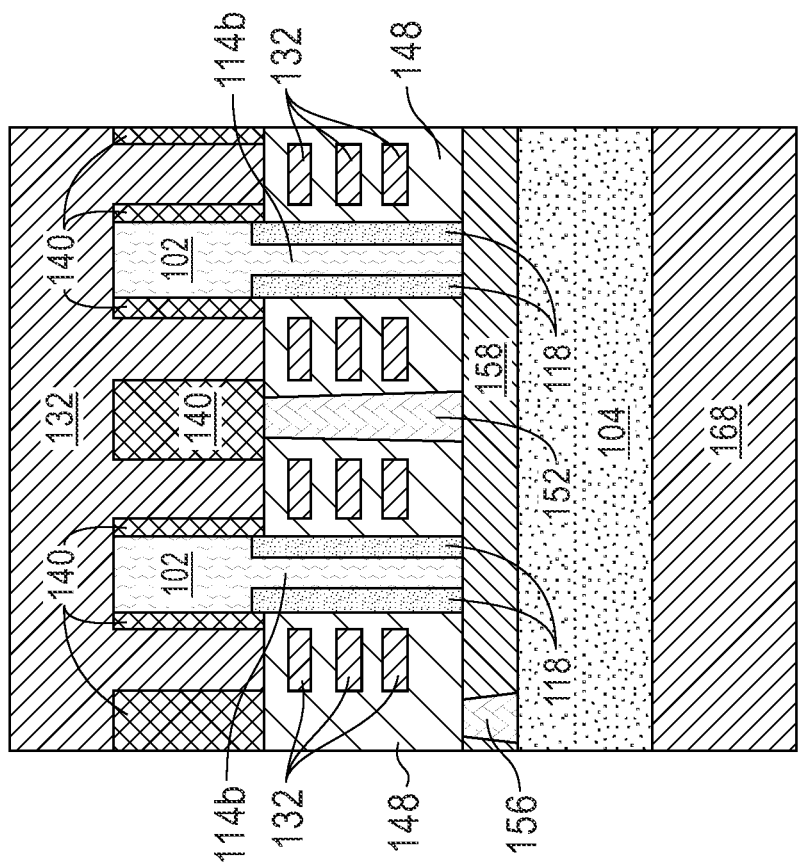
FIG. 11A, 11B, 11C depict cross-sectional side views of the semiconductor structure of FIG. 1 at a fabrication stage, in accordance with one embodiment of the present invention.
Figure 11B:
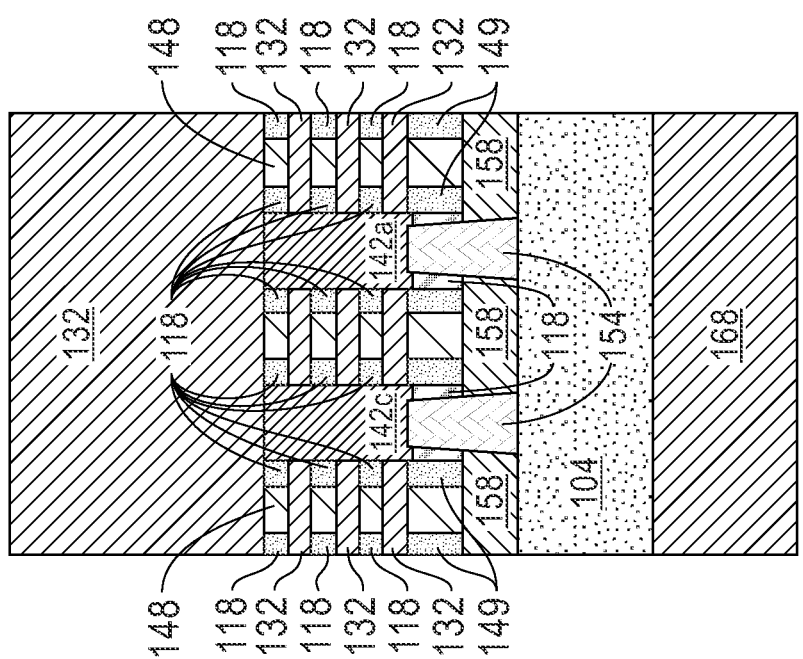
Figure 11C:
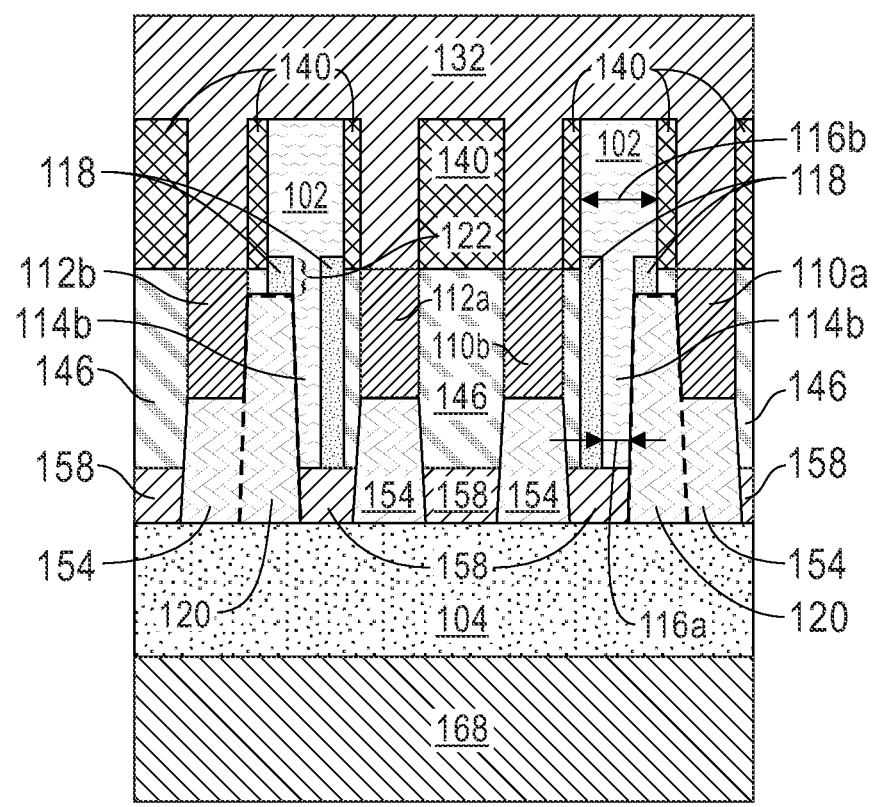

FIGS. 11A, 11B, and 11C are cross-sectional side views of the semiconductor structure 100 at a fabrication step, in accordance with one embodiment of the present invention. The semiconductor structure 100 is flipped over to complete the steps for power delivery. The carrier wafer 168 supports the semiconductor structure 100 while the structural substrate 130 and the etch stop layer 134 are removed. The etch stop layer 134 is included so that the structural substrate 130 can be removed with a rough/fast grinding or etch method that might otherwise damage portions of the silicon substrate 132 or the power rails 102.

Figure 12C:
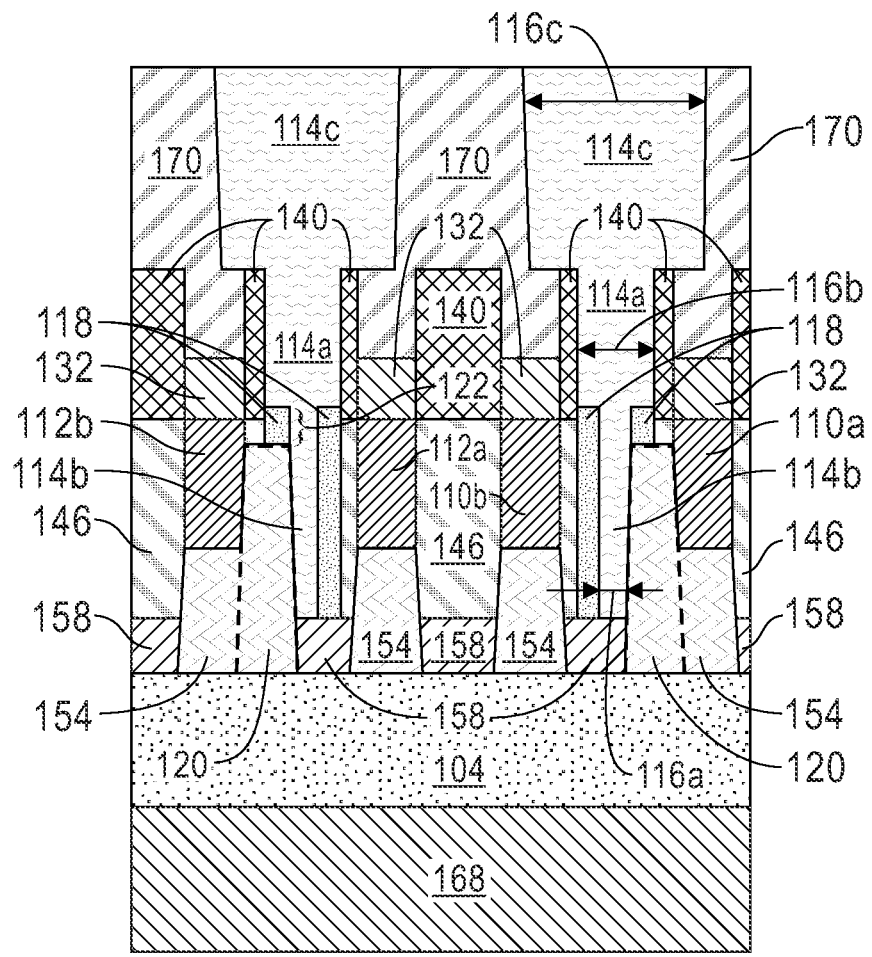

FIGS. 12A, 12B, and 12C are cross-sectional side views of the semiconductor structure 100 at a fabrication step, in accordance with one embodiment of the present invention. After the structural substrate 130 and the etch stop layer 134 are removed, the silicon substrate 132 may be recessed and replaced by a backside ILD 170. The backside ILD 170 insulates the NFET regions 110a, b and PFET regions 112a, b from the power delivery network that will be fabricated on top of the backside ILD 170 and the STI 140. After the backside ILD 170 is formed, the third section 114c of the power rails 102 is formed using a mask and lithographic patterning. The third section 114c has the third CD 116c, which is the largest CD of the power rails 102. The large CD of the third section 114c enables a higher amount of current to pass through without increasing the resistance.

Figure 13B:
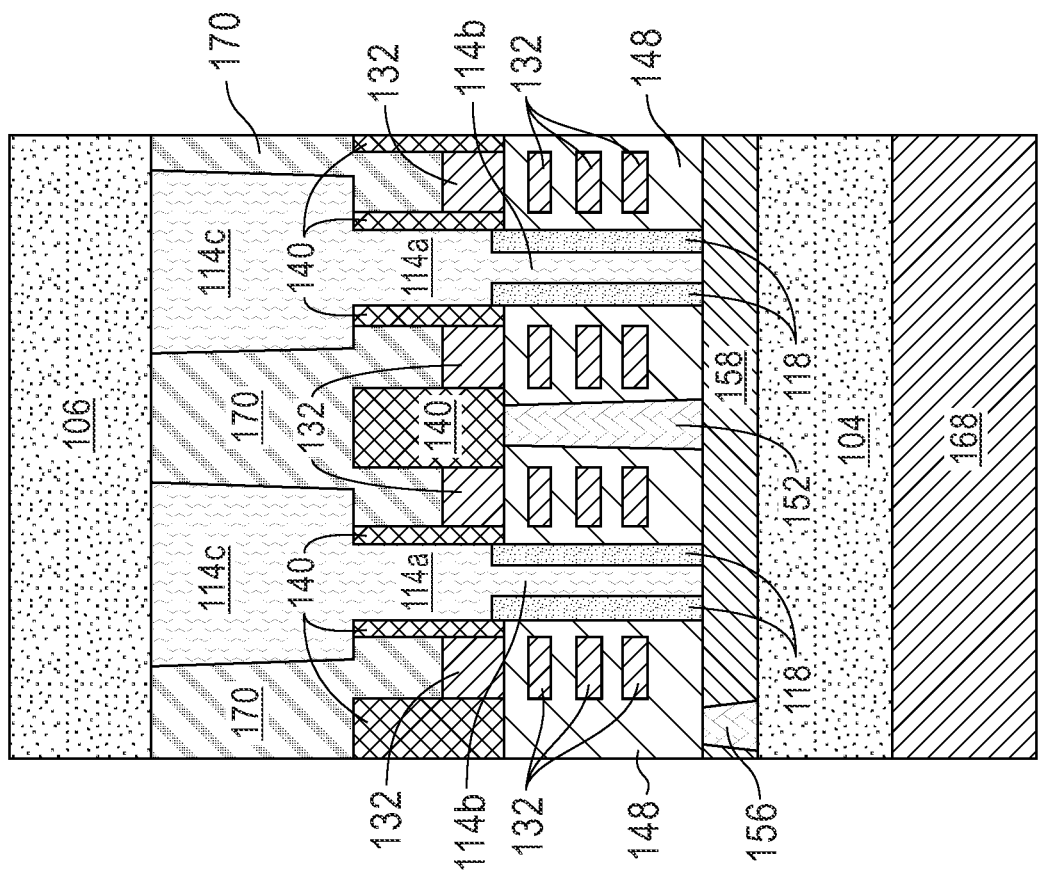
FIG. 13A, 13B, 13C depict cross-sectional side views of the semiconductor structure of FIG. 1 at a fabrication stage, in accordance with one embodiment of the present invention.
Figure 13A:
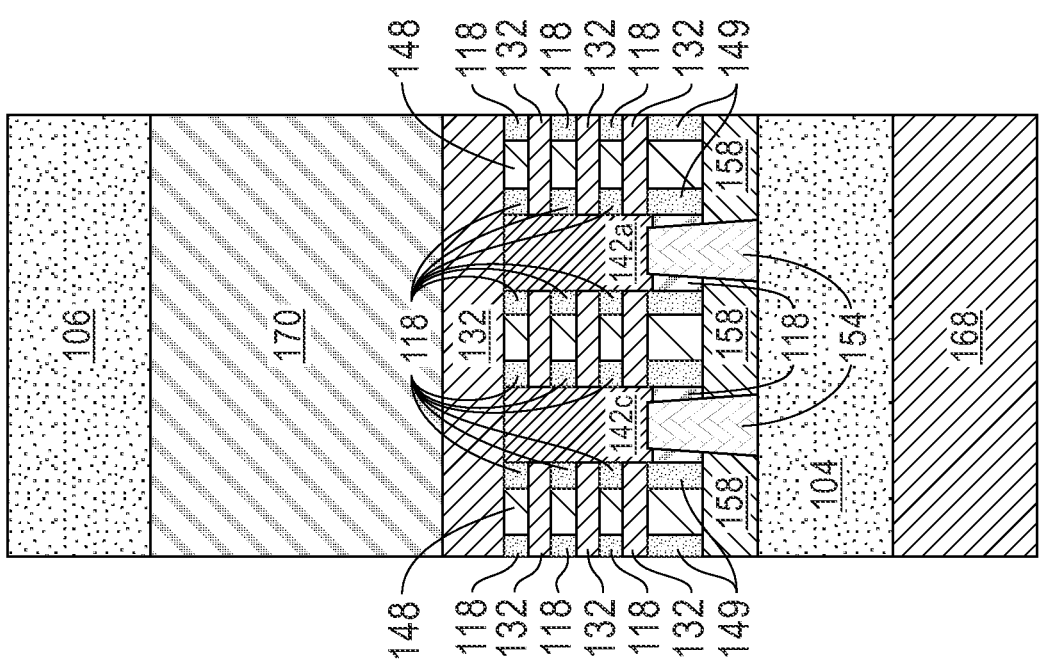
Figure 13C:
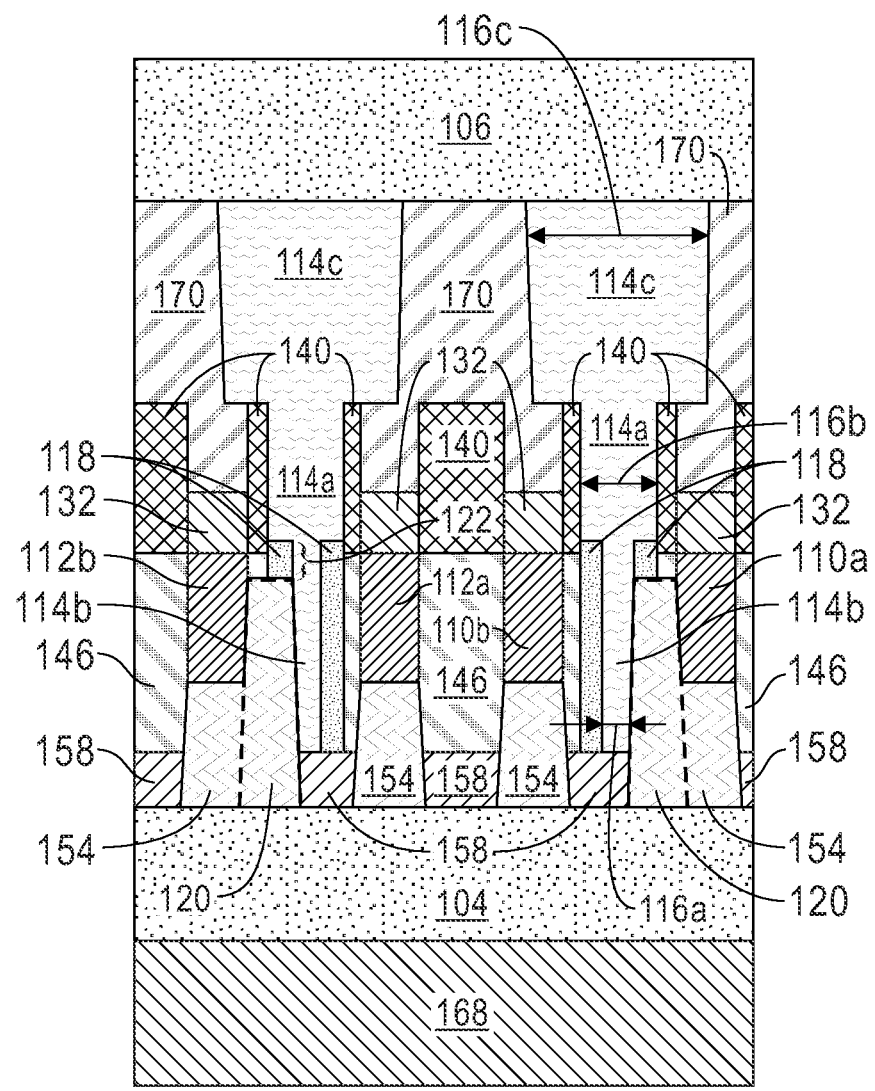

FIGS. 13A, 13B, and 13C are cross-sectional side views of the semiconductor structure 100 at a fabrication step, in accordance with one embodiment of the present invention. The semiconductor structure 100 has the BSPDN 106 fabricated above, and connected to, the power rails 102 (i.e., connected to the third section 114c). The BSPDN 106 provides power and reference voltage to the NFET regions 110a, b and PFET regions 112a, b on the semiconductor structure 100 in an efficient way. This BSPDN 106 is a network of interconnects that is separate from the BEOL layers 104. Traditionally, both networks are fabricated through back-end-of-line (BEOL) processing on the frontside of the wafer, but the BSPDN 106 has been found to be the most efficient way of delivering power to the NFET regions 110a, b and PFET regions 112a, b. For example, the BSPDN 106 largely improves the supply-voltage (or IR) drop that is caused by a resistance increase in the BEOL of traditional designs.

As mentioned above, the large CD of the third section 114c enables power to flow through the power rails 102 with a reduced amount of IR loss due to resistance. Additionally, the broad area of the third section 114c enables the BSPDN 106 to easily connect with the power rail 102, even if the alignment is not perfect. Thus, the power rails 102 with multiple sections or multiples stages enables a better delivery of power signals to the device region 108 of the semiconductor structure 100. To reiterate, rather than having a single via traveling from the S/Ds 142, 144 to the BSPDN 106, the power rails 102 disclosed herein include multiple sections 114a, b, c that are able to use the maximum CD for each vertical space within the device region 108 (e.g., the first section 114a has the first CD 116a bounded by the STI 140, the second section 114b has the second CD 116b bounded by the inner spacer 118, and the third section 114c has the third CD 116c bounded by the backside ILD 170).

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor structure, comprising:
   a first transistor device on a substrate;
   a second transistor device on the substrate;
   a power rail between the first transistor device and the second transistor device, comprising:

a first section comprising a first critical dimension (CD);
a second section comprising a second CD smaller than the first CD due to an inner spacer; and
a third section comprising a third CD; and
a contact via directly physically contacting and overlapping a majority of a lateral side of the second section.

2. The semiconductor structure of claim 1, wherein the first section is bounded by a shallow trench isolation (STI).

3. The semiconductor structure of claim 1, further comprising a backside power delivery network electrically connected to the power rail.

4. The semiconductor structure of claim 1, further comprising an inner spacer between the second section and a first gate of the first transistor device, and between the second section and a second gate of the second transistor device.

5. The semiconductor structure of claim 4, further comprising a contact via electrically connected between the second section and a source/drain contact of the first transistor device.

6. The semiconductor structure of claim 1, wherein the first transistor device and the second transistor device comprise a same type of device selected from the group consisting of: PFET devices and NFET devices.

7. The semiconductor structure of claim 1, wherein the first CD is smaller than the third CD and the second CD is smaller than the first CD.

8. A method, comprising:
forming a deep gate cut between a first transistor device and a second transistor device of a substrate;
forming a first section of a power rail in the deep gate cut;
forming an inner spacer in the deep gate cut above the first section;
forming a second section of the power rail between the inner spacer;
forming a third section of the power rail below the first section; and
forming a contact via directly physically contacting and overlapping a majority of a lateral side of the second section.

9. The method of claim 8, further comprising flipping the substrate before forming the third section.

10. The method of claim 9, further comprising forming a back-end-of-line network before flipping the substrate.

11. The method of claim 8, further comprising forming a source/drain (S/D) contact electrically connected to the second section and a source/drain of the first transistor device.

12. The method of claim 11, further comprising forming a contact via (VBPR) electrically connected between the second section and the S/D contact.

13. The method of claim 8, further comprising recessing a top of the first section below a first source/drain (S/D) of the first transistor device and a second S/D of the second transistor device.

14. The method of claim 8, further comprising forming a backside power delivery network (BSPDN) electrically connected to the third section.

15. The method of claim 8, wherein the first section is formed with a first critical dimension (CD), the second section is formed with a second CD different from the first CD, and the third section is formed with a third CD different from the first CD and the second CD.

16. A semiconductor structure, comprising:
a power rail electrically connected between a first source/drain (S/D) of a first transistor device and a backside power delivery network (BSPDN), comprising:
a first section comprising a first critical dimension (CD);
a second section comprising a second CD; and
a third section comprising a third CD, wherein the second CD is smaller than the first CD and the third CD due to an inner spacer; and
a contact via directly physically contacting and overlapping a majority of a lateral side of the second section.

17. The semiconductor structure of claim 16, wherein the first CD is smaller than the third CD due to being bounded by a shallow trench isolation (STI).

18. The semiconductor structure of claim 16, wherein the power rail is separated from a second S/D by an inner spacer.

19. The semiconductor structure of claim 18, wherein the inner spacer is between the second section and a first gate of the first transistor device.

20. The semiconductor structure of claim 16, wherein the third section is bounded by a backside interlayer dielectric (ILD).

21. A semiconductor structure, comprising:
a power rail, comprising:
a first section comprising a first critical dimension (CD), and bounded by a shallow trench isolation structure (STI);
a second section comprising a second CD, and bounded by an inner spacer; and
a third section comprising a third CD, and bounded by a backside interlayer dielectric (ILD); and
a contact via directly physically contacting and overlapping a majority of a lateral side of the second section.

22. The semiconductor structure of claim 21, wherein the first section is between the second section and the third section.

23. The semiconductor structure of claim 21, further comprising a contact via electrically connected between the second section and a source/drain contact.

24. A method, comprising:
forming a first section of a power rail, wherein the first section comprises a first critical dimension (CD);
forming a second section of the power rail, wherein the second section comprises a second CD smaller than the first CD due to an inner spacer;
forming a third section of the power rail, wherein the third section comprises a third CD, wherein the first section is vertically above the third section and below the second section; and
forming a contact via directly physically contacting and overlapping a majority of a lateral side of the second section.

25. The method of claim 24, further comprising:
forming a back-end-of-line network above the second section; and
forming a backside power delivery network below the third section.

* * * * *